(12) United States Patent
Buell

(10) Patent No.: US 7,782,151 B2
(45) Date of Patent: Aug. 24, 2010

(54) VCO DIGITAL RANGE SELECTION

(75) Inventor: Brian J. Buell, Gilbert, AZ (US)

(73) Assignee: Integrated Device Technology inc., San Jose, CA (US)

( * ) Notice: Subject to any disclaimer, the term of this patent is extended or adjusted under 35 U.S.C. 154(b) by 0 days.

(21) Appl. No.: 11/441,262

(22) Filed: May 25, 2006

(65) Prior Publication Data

US 2006/0267693 A1   Nov. 30, 2006

Related U.S. Application Data

(60) Provisional application No. 60/684,422, filed on May 25, 2005.

(51) Int. Cl.
*H03B 5/12* (2006.01)
*H03C 3/22* (2006.01)

(52) U.S. Cl. .............. 331/177 V; 331/36 C; 331/117 R

(58) Field of Classification Search ............. 331/177 V, 331/36 C, 117 FE, 117 R, 167
See application file for complete search history.

(56) References Cited

U.S. PATENT DOCUMENTS

| | | | |
|---|---|---|---|
| 5,644,270 A | 7/1997 | Moyer et al. | |
| 6,563,392 B2 * | 5/2003 | Gomez et al. | 331/117 FE |
| 6,680,657 B2 * | 1/2004 | Wang et al. | 331/177 V |
| 6,774,736 B1 | 8/2004 | Kwek et al. | |
| 6,861,913 B1 | 3/2005 | Herzel et al. | |
| 6,876,266 B2 | 4/2005 | Koo et al. | |
| 6,882,233 B2 | 4/2005 | Oh et al. | |
| 6,885,252 B2 | 4/2005 | Hsu | |
| 6,888,413 B1 | 5/2005 | Adams et al. | |
| 6,894,571 B2 | 5/2005 | Sumi et al. | |
| 6,906,596 B2 * | 6/2005 | Kitamura et al. | 331/36 C |
| 6,927,637 B1 * | 8/2005 | Koh et al. | 331/17 |
| 7,023,249 B1 | 4/2006 | Mulbrook | |
| 7,183,870 B2 * | 2/2007 | Takagi | 331/177 V |
| 7,221,234 B2 * | 5/2007 | Chien | 331/177 V |
| 7,321,271 B2 * | 1/2008 | Takinami et al. | 331/117 R |
| 2005/0111605 A1 | 5/2005 | Loke et al. | |
| 2005/0242895 A1 | 11/2005 | Lotfi | |

OTHER PUBLICATIONS

D. Hermansen et al. "A 0.18 µm CMOS Digitally Controlled Oscillator for Closed-Loop Modulation Systems," downloaded from web site: http://www.rtx.dk/Files/Filer/PDF/controlled.pdf, printout date: May 23, 2006, article date or initial posting date: both unknown, 6 pages.

Danny Abramovitch, "Phase-Locked Loops: A Control Centric Tutorial," Agilent Technologies, May 8, 2002, downloaded from web site: http://www.web-ee.com/primers/files/pll_tut_talk.pdf, printout date: May 23, 2006, 50 pages.

* cited by examiner

*Primary Examiner*—Robert Pascal
*Assistant Examiner*—Levi Gannon
(74) *Attorney, Agent, or Firm*—Panitch Schwarze, et al.

(57) ABSTRACT

An extended range voltage controller oscillator (VCO) circuit for use in a phase-locked loop (PLL) circuit is provided. The VCO circuit includes two additional pairs of varactors which are used to extend the range of the VCO circuit around its center frequency.

5 Claims, 3 Drawing Sheets

VCO DIGITAL RANGE SELECTION

CROSS-REFERENCE TO RELATED APPLICATIONS

This application claims the benefit of U.S. Patent Application No. 60/684,422, filed on May 25, 2005, entitled "VCO Digital Range Selection."

BACKGROUND OF THE INVENTION

A voltage controlled oscillator is an oscillator that changes its frequency according to a control voltage applied to its control input node. Voltage controlled oscillators (VCO's) have many applications in generating an oscillating voltage whose frequency is dependent upon a control voltage. One typical application of a VCO is in a phase locked loop (PLL) in which the output of the VCO is locked to an input frequency and the control voltage of the VCO is used as a reference voltage for other circuits.

In some designs, the total VCO frequency range is divided into a number of sub-ranges, allowing the VCO to operate with a lower control voltage gain. The lower VCO gain makes the VCO less susceptible to unwanted noise from the phase detector and PLL loop filter.

In some cases, the VCO may operate near the boundary of the selected frequency sub-range, causing the VCO gain to vary from the nominal value. This effect could lead to phase lock loop (PLL) instability or phase noise degradation. In addition, if the VCO nominally operates near the boundary of a frequency sub-range, operating temperature or voltage changes may make it necessary for the VCO to change sub-ranges during operation. This is undesirable as it would cause a large disturbance on the output signal of the VCO, thereby, affecting the system that uses the VCO.

FIG. 1 shows a prior art implementation of a VCO in a phase locked loop system. A buffer frequency divider block samples the output of the oscillator and feeds it back to the digital control block for comparison. The digital control block determines the center frequency of the VCO by selecting which capacitors are switched on for each half of the oscillating circuit. This implementation allows for frequency adjustments in discrete steps. The selection process may also include varying the control voltage to ensure that the VCO can oscillate at the desired target frequency when the switches are in a particular state. A voltage control node on the VCO is used to control the two varactor voltages. By changing the varactor voltages, the value of their capacitance changes to finely adjust the VCO to the desired operating frequency.

SUMMARY OF THE INVENTION

The present invention includes a VCO as described above wherein the selected frequency sub-range is subsequently extended to cover a larger frequency range. This prevents the VCO from operating at the boundary of the selected sub-range regardless of changes in operating temperature or voltage. In addition, the extended frequency range also prevents the possibility of the VCO changing from one sub-range to another during operation, thereby preventing any large disturbances on the output of the VCO.

BRIEF DESCRIPTION OF THE DRAWINGS

The following drawings provide examples of the invention. However, the invention is not limited to the precise arrangements, instrumentalities, scales, and dimensions shown in these examples, which are provided mainly for illustration purposes only. In the drawings.

DETAILED DESCRIPTION OF THE INVENTION

Figure 1:
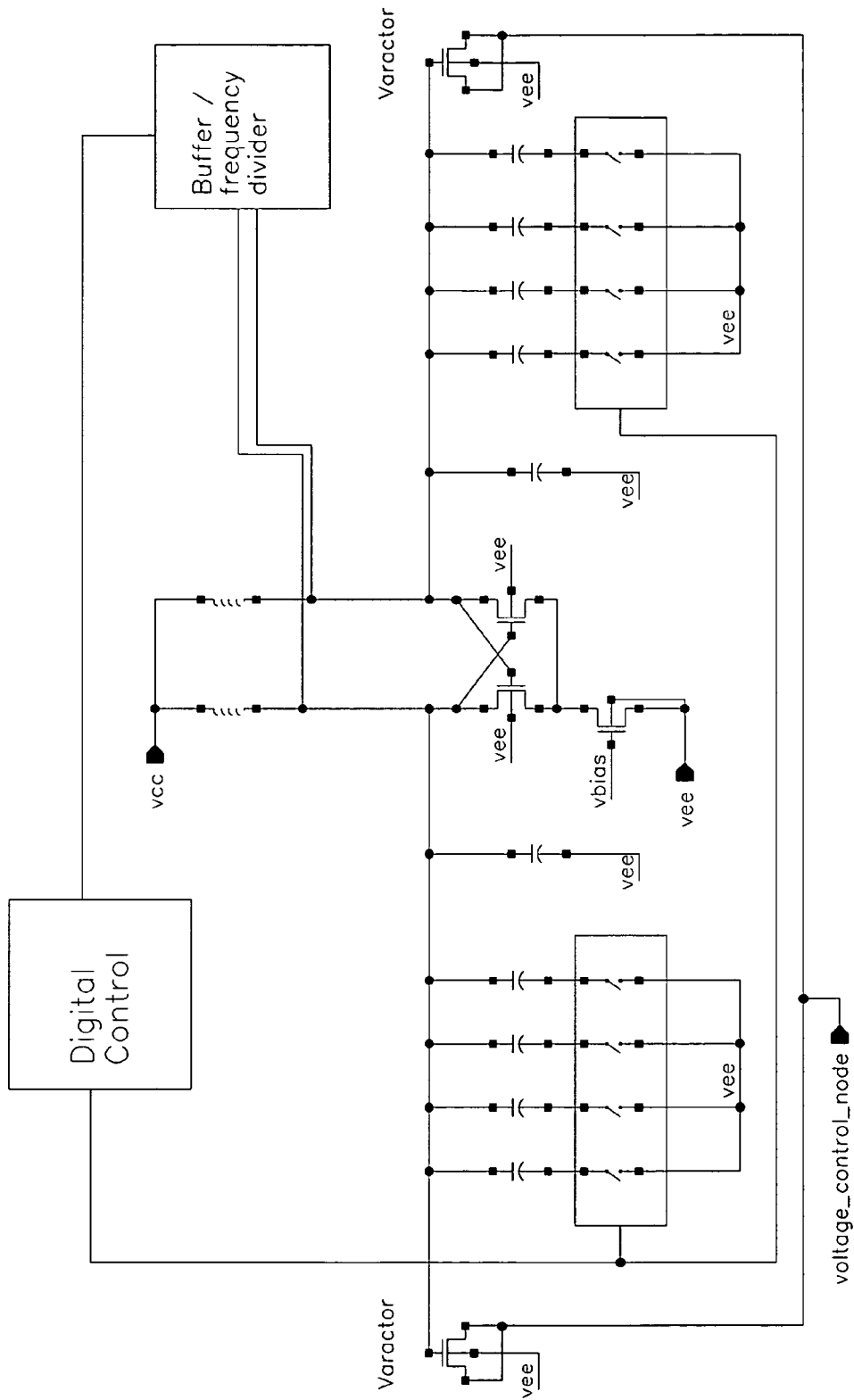
FIG. 1 shows a prior art implementation of a VCO in a phase locked loop system.
Figure 2:
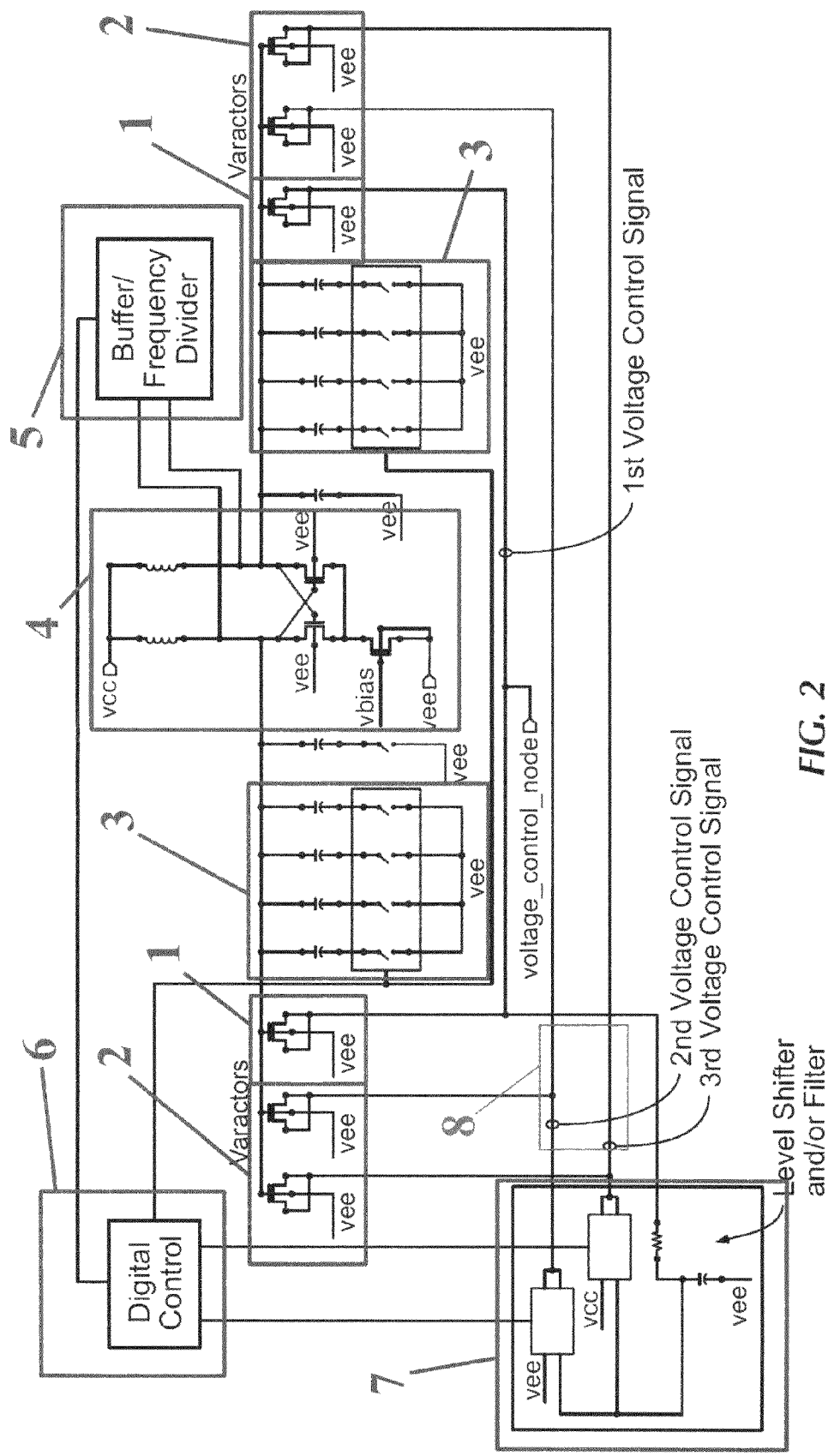
FIG. 2 shows a combination block and schematic diagram of a PLL system in accordance with one preferred embodiment of the present invention.

FIG. 2 shows a combination block and schematic diagram of a PLL system having a control circuit in accordance with one preferred embodiment of the present invention. The oscillating circuit implements a total of six varactors in its circuit configuration. The additional four varactors, two for each half of the circuit, are used to control the extension of the frequency range for the VCO. The VCO includes a first input that receives a first voltage control signal from an output of a PLL circuit loop filter, a second input that receives a second voltage control signal, and a third input that receives a third voltage control signal. A first pair of varactors are connected to the first input of the VCO. The first pair of varactors adjust the frequency of the VCO based on the first voltage control signal. A second pair of varactors are connected to the second input of the VCO, and a third pair of varactors connected to the third input of the VCO. An output provides a periodic output signal. A common terminal of the varactors in each of the respective pairs has a shared connection with the VCO output, and the VCO circuit has two halves, each varactor in the pairs being used for a respective half of the VCO circuit. The control circuit includes a digital control block that has two additional control signal outputs that are used to control the capacitance of the four additional varactors (i.e., the second and third pairs of varactors) in the circuit by varying the voltage. As the digital control block selects the appropriate capacitors via the switches, one pair of the additional varactors is held in a "high" capacitance state while the other pair is held in a "low" capacitance state. After the switches are set and the capacitors selected, the additional varactors are then coupled to the control voltage to extend the range of the VCO around the selected center frequency. Thus, the control circuit has a first state wherein the control circuit provides the second and third voltage control signals. In particular, the second voltage control signal maintains the second pair of varactors in the high capacitance state relative to the range of capacitance provided by the varactors, and the third voltage control signal is maintains the third pair of varactors in the low capacitance state relative to the range of capacitances provided by the varactors. The control circuit has a second state wherein the control circuit provides a signal derived from the first voltage control signal to the second and third inputs. Thus, the second and third voltage control signals can be the same as the first voltage control signal in the second state. A frequency divider is connected to the output of the VCO for dividing the output signal of the VCO. A phase detector includes a first input that receives the divided VCO signal, a second input that receives a reference signal from a reference oscillator, and an output. The phase detector compares the reference signal to the divided VCO signal and generates a phase detector error signal representing the detected phase difference at its output. The first voltage control signal is derived from the output of the phase detector. Depending on the implementation, the coupling to the control voltage may include level shifting and/or filtering of the control voltage of the additional varactors.

For example, a level shifter may be connected to the Digital Control, and the level shifter may be adapted to shift the voltage level of the first voltage control signal when the control circuit is in a second state, thereby providing the second and third voltage control signals at a different level than the first voltage control signal. Additionally and/or alternately, a filter may be connected to the Digital Control, and the filter may be adapted to filter the first voltage control signal when the control circuit is in the second state, thereby providing filtered second and third voltage control signals.

Each of the varactors is a four terminal varactor having a gate terminal connected to the VCO output, source and drain terminals connected to the first, second or third voltage control signals, and a substrate (bulk) terminal connected to a supply voltage. The common terminal of the varactors is the gate of each of the varactors.

The PLL system further includes a first bank of switched capacitors arranged in parallel for use in one half of the VCO circuit, and a second bank of switched capacitors arranged in parallel for use in the other half of the VCO circuit. The capacitors in a respective bank of capacitors are switched on coarsely to determine the VCO center frequency. The first pair of varactors provides a fine adjustment of the VCO center frequency. During the first state, the control circuit further outputs signals for use in selecting the capacitors to switch on in the respective banks of capacitors.

Figure 3:
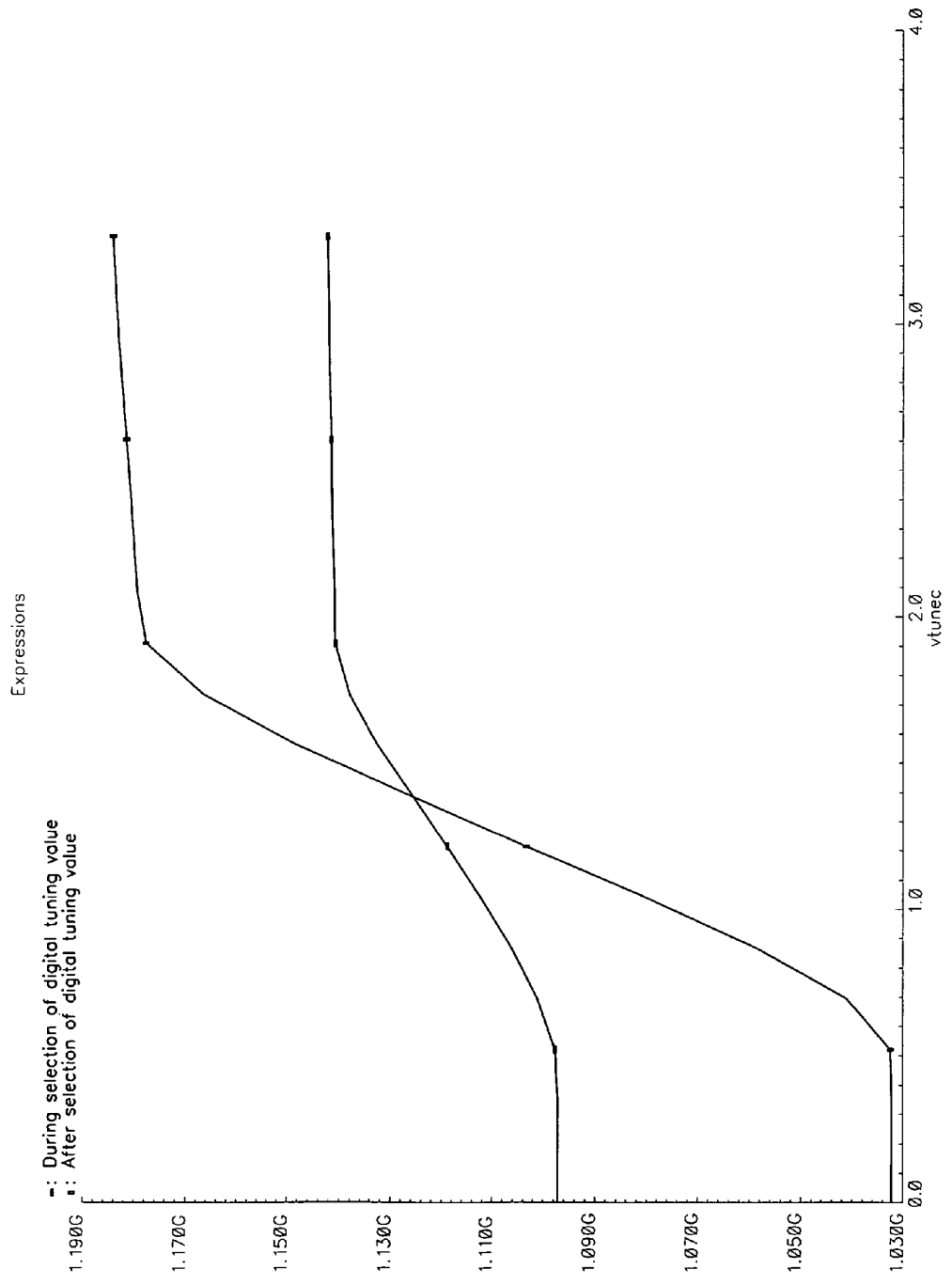
FIG. 3 shows a comparison of the frequency range during selection of a digital tuning value with only two varactors coupled to the control voltage in accordance with the prior art versus the frequency range after selection of a digital tuning value with all six varactors coupled to the control voltage in accordance with one preferred embodiment of the present invention.

FIG. 3 shows a comparison of the frequency range during selection of a digital tuning value with only two varactors coupled to the control voltage versus the frequency range after selection of a digital tuning value with all six varactors coupled to the control voltage. In this case, the frequency range is extended approximately by a factor of 3 with the use of all six varactors in the VCO.

It will be appreciated by those skilled in the art that changes could be made to the embodiments described above without departing from the broad inventive concept thereof. It is understood, therefore, that this invention is not limited to the particular examples disclosed, but it is intended to cover modifications within the spirit and scope of the present invention as defined by the appended claims.

What is claimed is:

1. An extended range voltage controlled oscillator (VCO) circuit for use in a phase-locked loop (PLL) circuit, the VCO circuit comprising:
    (a) a VCO including:
        (i) an input that receives a first voltage control signal from an output of a PLL circuit loop filter,
        (ii) a first pair of varactors connected to the input of the VCO, the first pair of varactors adjusting the frequency of the VCO based on the first voltage control signal,
        (iii) a second pair of varactors, the second pair of varactors configured to receive a second voltage control signal,
        (iv) a third pair of varactors, the third pair of varactors configured to receive a third voltage control signal, and
        (v) an output that provides a periodic output signal,
        wherein a common terminal of the varactors in each of the respective pairs has a shared connection with the VCO output, and the VCO circuit has two halves, each varactor in the pairs being used for a respective half of the VCO circuit;
    (b) a control circuit including:
        (i) a first state wherein the control circuit provides the second and third voltage control signals, wherein the second voltage control signal is adapted to maintain the second pair of varactors in a high capacitance state relative to the range of capacitance provided by the varactors, and the third voltage control signal is adapted to maintain the third pair of varactors in a low capacitance state relative to the range of capacitances provided by the varactors, the second and third voltage control signals being set to fixed voltage levels independent of a voltage level of the first voltage control signal, and
        (ii) a second state wherein the control circuit provides the second and third voltage control signals, the second and third voltage control signals being derived from the first voltage control signal,
        wherein the second and third pairs of varactors extend the range of the VCO circuit around its center frequency; and
    (c) a first bank of switched capacitors arranged in parallel for use in one half of the VCO circuit, and a second bank of switched capacitors arranged in parallel for use in the other half of the VCO circuit, wherein the capacitors in a respective bank of capacitors that are switched on coarsely determine the VCO center frequency, the first pair of varactors providing a fine adjustment of the VCO center frequency, and
    wherein during the first state, the control circuit further outputs signals for use in selecting the capacitors to switch on in the respective banks of capacitors.

2. The VCO circuit of claim 1 wherein the common terminal is the gate of each of the varactors.

3. The VCO circuit of claim 1 wherein each of the varactors is a four terminal varactor having a gate terminal connected to the VCO output, source and drain terminals connected to the first, second, or third voltage control signals, and a substrate (bulk) terminal connected to a supply voltage.

4. The VCO circuit of claim 1 further comprising:
    (d) a filter adapted to filter the first voltage control signal when the control circuit is in the second state, thereby providing filtered second and third voltage control signals.

5. The VCO circuit of claim 1 further comprising:
    (d) a level shifter adapted to shift the voltage level of the first control voltage when the control circuit is in the second state, thereby providing the second and third voltage control signal at a different level than the first voltage control signal.

* * * * *